United States Patent
Kang et al.

(10) Patent No.: US 9,269,578 B2
(45) Date of Patent: Feb. 23, 2016

(54) METHOD OF FORMING AN EPITAXIAL LAYER ON A SUBSTRATE, AND APPARATUS AND SYSTEM FOR PERFORMING THE SAME

(71) Applicant: Samsung Electronics Co., Ltd., Suwon-si (KR)

(72) Inventors: Sung-Ho Kang, Osan-si (KR); Bong-Jin Kuh, Suwon-si (KR); Yong-Kyu Joo, Hwaseong-si (KR); Sung-Ho Heo, Suwon-si (KR); Hee-Seok Kim, Seongnam-si (KR); Yong-Sung Park, Cheonan-si (KR)

(73) Assignees: SAMSUNG ELECTRONICS CO., LTD., Suwon-si, Gyeonggi-do (KR); KOOKJE ELECTRIC KOREA CO., LTD., Cheonan-si, Chungcheongnam-do (KR)

( * ) Notice: Subject to any disclaimer, the term of this patent is extended or adjusted under 35 U.S.C. 154(b) by 0 days.

(21) Appl. No.: 14/152,191

(22) Filed: Jan. 10, 2014

(65) Prior Publication Data
US 2014/0193967 A1 Jul. 10, 2014

(30) Foreign Application Priority Data
Jan. 10, 2013 (KR) .......... 10-2013-0002954

(51) Int. Cl.
H01L 21/311 (2006.01)
H01L 21/02 (2006.01)
H01L 21/67 (2006.01)
C30B 25/02 (2006.01)
C30B 29/06 (2006.01)

(52) U.S. Cl.
CPC .......... *H01L 21/02664* (2013.01); *C30B 25/02* (2013.01); *C30B 29/06* (2013.01); *H01L 21/67109* (2013.01); *H01L 21/0262* (2013.01); *H01L 21/02532* (2013.01)

(58) Field of Classification Search
CPC ..................... H01L 21/02518; H01L 21/0262
USPC .................................. 438/694, 584, 607, 492
See application file for complete search history.

(56) References Cited

U.S. PATENT DOCUMENTS 7,836,497 B2  11/2010  Hossain et al.
8,033,823 B2  10/2011  Nakao et al.
8,093,127 B2  1/2012  Lee
(Continued)

FOREIGN PATENT DOCUMENTS

JP  2012-023369  2/2012
KR  10-0819176 B1  4/2008
(Continued)

*Primary Examiner* — Julia Slutsker
(74) *Attorney, Agent, or Firm* — Muir Patent Law, PLLC

(57) ABSTRACT

In a method of forming an epitaxial layer, an etching gas may be decomposed to form decomposed etching gases. A source gas may be decomposed to form decomposed source gases. The decomposed source gases may be applied to a substrate to form the epitaxial layer on the substrate. A portion of the epitaxial layer on a specific region of the substrate may be etched using the decomposed etching gases. Before the etching gas is introduced into the reaction chamber, the etching gas may be previously decomposed. The decomposed etching gases may then be introduced into the reaction chamber to etch the epitaxial layer on the substrate. As a result, the epitaxial layer on the substrate may have a uniform distribution.

16 Claims, 8 Drawing Sheets

(56) References Cited

U.S. PATENT DOCUMENTS

| | | |
|---|---|---|
| 2002/0159642 A1 | 10/2002 | Whitney |
| 2003/0092233 A1* | 5/2003 | Furukawa et al. ............ 438/200 |
| 2006/0156982 A1 | 7/2006 | Kim et al. |
| 2007/0084408 A1 | 4/2007 | Yudovsky et al. |
| 2008/0245303 A1* | 10/2008 | Yamamoto .................... 118/725 |
| 2009/0162315 A1 | 6/2009 | Terman et al. |
| 2009/0197424 A1 | 8/2009 | Sakai et al. |
| 2010/0196524 A1 | 8/2010 | Meindert De Vos et al. |
| 2011/0246505 A1 | 10/2011 | Jung |
| 2012/0009697 A1 | 1/2012 | Maeng et al. |
| 2012/0322188 A1* | 12/2012 | Maeng et al. ................... 438/46 |
| 2013/0014694 A1* | 1/2013 | Maeng et al. ................... 117/89 |
| 2013/0330930 A1* | 12/2013 | Saido et al. ................... 438/758 |

FOREIGN PATENT DOCUMENTS

| | | |
|---|---|---|
| KR | 10-0839911 B1 | 6/2008 |
| KR | 10-2010-0128854 A | 12/2010 |
| KR | 10-2011-0033482 A | 3/2011 |
| KR | 10-2011-0078474 A | 7/2011 |

* cited by examiner

METHOD OF FORMING AN EPITAXIAL LAYER ON A SUBSTRATE, AND APPARATUS AND SYSTEM FOR PERFORMING THE SAME

CROSS-RELATED APPLICATION

This application claims priority under 35 USC §119 to Korean Patent Application No. 10-2013-0002954, filed on Jan. 10, 2013 in the Korean Intellectual Property Office (KIPO), the contents of which are herein incorporated by reference in their entirety.

BACKGROUND

Generally, a silicon source gas may be applied to a silicon substrate to grow silicon from the silicon substrate, thereby forming an epitaxial layer. Further, a silicon source gas and an etching gas may be applied to a silicon substrate to grow silicon from the silicon substrate and to etch the silicon on an insulating layer of the silicon substrate by the etching gas, thereby forming a selective epitaxial layer.

When the etching gas is not in its decomposed form in a reaction chamber, the epitaxial layer on the insulating layer may not be removed. In order to prevent the above-mentioned problem, a single type apparatus may perform an SEG process at a high temperature. In contrast, a batch type apparatus may require a great amount of the etching gas. In the batch type apparatus, the etching gas and the silicon source gas may not be applied simultaneously. As a result, the epitaxial layer on the silicon substrate may not have a uniform distribution.

SUMMARY

Example embodiments relate to a method of forming an epitaxial layer, and an apparatus and a system for performing the same. More particularly, example embodiments relate to a method of forming an epitaxial layer on a substrate by a selective epitaxial growth (SEG) process, and an apparatus and a system for performing the method.

Example embodiments provide a method of forming an epitaxial layer having a uniform distribution.

Example embodiments also provide an apparatus for forming the above-mentioned method.

Example embodiments still also provide a system including the above-mentioned apparatus.

According to some example embodiments, a method of forming an epitaxial layer on a substrate is provided. In the method of forming the epitaxial layer, an etching gas may be decomposed to form decomposed etching gases. A source gas may be decomposed to form decomposed source gases. The decomposed source gases may be applied to a substrate to form the epitaxial layer on the substrate. A portion of the epitaxial layer on a specific region of the substrate may be etched using the decomposed etching gases.

In example embodiments, decomposing the etching gas includes converting the etching gas into plasma.

In example embodiments, the method further includes cooling the source gas to prevent the source gas from being decomposed before applying the source gas to the substrate.

In example embodiments, cooling the source gas includes supplying a cooling gas to a cooling unit to cool the source gas.

In example embodiments, the method may further include etching a native oxide layer formed on the substrate.

In one embodiment, the method includes performing the decomposing of the source gas, the applying of the decomposed source gas to the substrate, and the etching a portion of the epitaxial layer in a reaction chamber.

The method may further include decomposing the etching gas to form the decomposed etching gases prior to supplying the etching gas to the reaction chamber.

In one embodiment, the method further includes forming an epitaxial layer on a second substrate simultaneously with forming the epitaxial layer on the substrate by using a multi-substrate receiving structure inserted into the reaction chamber. The multi-substrate receiving structure may include blocking plates disposed between upper substrate holders and lower substrate holders. In addition, for each blocking plate, an upper substrate holder adjacent the blocking plate above the blocking plate may be further from the blocking plate than a lower substrate holder adjacent the blocking plate below the blocking plate.

In one embodiment, the method additionally includes supplying the etching gas and the source gas from a mixed gas line to an injecting unit in the reaction chamber.

The method may further include heating the reaction chamber; and applying a cooling gas to the injecting unit to cool the etching gas and the source gas in the injecting unit.

According to some example embodiments, an apparatus is provided for forming an epitaxial layer on a substrate. The apparatus may include a reaction chamber, a boat, a heater, an injecting unit and a decomposing unit. The boat may be arranged in the reaction chamber to receive a plurality of substrates. The heater may be provided to the reaction chamber to heat the reaction chamber. The injecting unit may be arranged in the reaction chamber to inject a source gas and an etching gas to the substrates in the boat. The decomposing unit may decompose the etching gas introduced into the injecting unit.

In example embodiments, the apparatus may further include a cooling unit configured to cool the injecting unit to prevent the source gas from being decomposed in the injecting unit.

In example embodiments, the cooling unit may include a cooling duct configured to surround the injecting unit. A cooling gas may pass through a passageway between the cooling duct and the injecting unit.

In example embodiments, the cooling duct may have a triple structure including a quartz member and an adiabatic member inserted into the quartz member.

In example embodiments, the apparatus may further include an etching gas line connected to the decomposing unit, a mixed gas line connected between the decomposing unit and the injecting unit, and a source gas line connected to the mixed gas line. The etching gas may pass through the etching gas line. The decomposed etching gases and the source gas may pass through the mixed gas line. The source gas may pass through the source gas line.

In example embodiments, the apparatus may further include an etching gas line connected to the decomposing unit, a decomposed etching gas line extended from the decomposing unit, and a source gas line. The etching gas may pass through the etching gas line. The decomposed etching gases may pass through the decomposed etching gas line. The source gas may pass through the source gas line. The injecting unit may further include a first injector connected to the source gas line to inject the source gas, and a second injector connected to the decomposed etching gas line to inject the decomposed etching gases.

In example embodiments, the boat may include a boat body configured to receive the substrates, a substrate holder formed on an inner surface of the boat body to support lower edge portions of the substrates, and a plurality of blocking plates arranged between the substrate holders to block interferences between the substrates. The substrate holders may be arranged by the same vertical interval. Each of the blocking plates may be positioned closer to an adjacent upper substrate holder than an adjacent lower substrate holder.

In example embodiments, the boat may include a boat body configured to receive the substrates, a plurality of blocking plates horizontally formed on an inner surface of the boat body to block interferences between the substrates, and supporting pins formed on upper surfaces of the blocking plates to support lower surfaces of the substrates.

According to some example embodiments, there may be provided a system for forming an epitaxial layer. The system may include a plurality of loadlock chambers, an etching chamber, a plurality of apparatuses for forming the epitaxial layer and a transfer chamber. A plurality of substrates may be on standby in the loadlock chambers. The etching chamber may be arranged in front of the loadlock chambers to remove native oxide layers on the substrates. The apparatuses may be arranged in front of the loadlock chambers to form the epitaxial layers on the substrates. The transfer chamber may be arranged between the loadlock chambers and the etching chamber, and between the apparatuses to transfer the substrates. The apparatuses may include a reaction chamber, a boat, a heater, an injecting unit and a decomposing unit. The boat may be arranged in the reaction chamber to receive a plurality of substrates. The heater may be provided to the reaction chamber to heat the reaction chamber. The injecting unit may be arranged in the reaction chamber to inject a source gas and an etching gas to the substrates in the boat. The decomposing unit may decompose the etching gas introduced into the injecting unit.

In example embodiments, the etching chamber and the apparatuses may be arranged in parallel with each other.

According to example embodiments, before the etching gas may be introduced into the reaction chamber, the etching gas may be previously decomposed. The decomposed etching gases may then be introduced into the reaction chamber to etch the epitaxial layer on the substrate. Thus, the epitaxial layer on the substrate may have a uniform distribution.

Further, the source gas may not be decomposed in the injecting unit because the cooling unit may cool the injecting unit so that injecting holes of the injecting unit are not clogged with the decomposed source gases decomposed in the injecting unit.

Furthermore, the system may include the loadlock chambers, the etching chamber and the batch type apparatuses having a clustered structure so that the epitaxial layers having the uniform distribution may be simultaneously formed on the substrates.

BRIEF DESCRIPTION OF THE DRAWINGS

Example embodiments will be more clearly understood from the following detailed description taken in conjunction with the accompanying drawings.

FIG. 1 is a cross-sectional view illustrating an apparatus for forming an epitaxial layer in accordance with example embodiments;

FIG. 2 is an exemplary cross-sectional view taken along a line II-II' in FIG. 1;

FIG. 3 is an exemplary enlarged cross-sectional view of a portion III in FIG. 2 illustrating a cooling unit of the apparatus;

FIG. 4 is a cross-sectional view illustrating a cooling unit of an apparatus in accordance with example embodiments;

FIG. 5 is an exemplary enlarged cross-sectional view illustrating a boat of the apparatus in FIG. 1;

FIG. 6 is a cross-sectional view illustrating a boat of an apparatus in accordance with example embodiments;

FIG. 7 is a cross-sectional view illustrating an apparatus for forming an epitaxial layer in accordance with example embodiments;

FIG. 8 is an exemplary plan view illustrating a system for forming an epitaxial layer including the apparatus in FIG. 1;

FIG. 9 is a flow chart illustrating a method of forming an epitaxial layer using the apparatus in FIG. 1 and the system in FIG. 8, according to certain exemplary embodiments; and FIG. 10 is a flow chart illustrating a method of forming an epitaxial layer using the apparatus in FIG. 7 and the system in FIG. 8, according to certain exemplary embodiments.

DETAILED DESCRIPTION OF THE EMBODIMENTS

Figure 1:
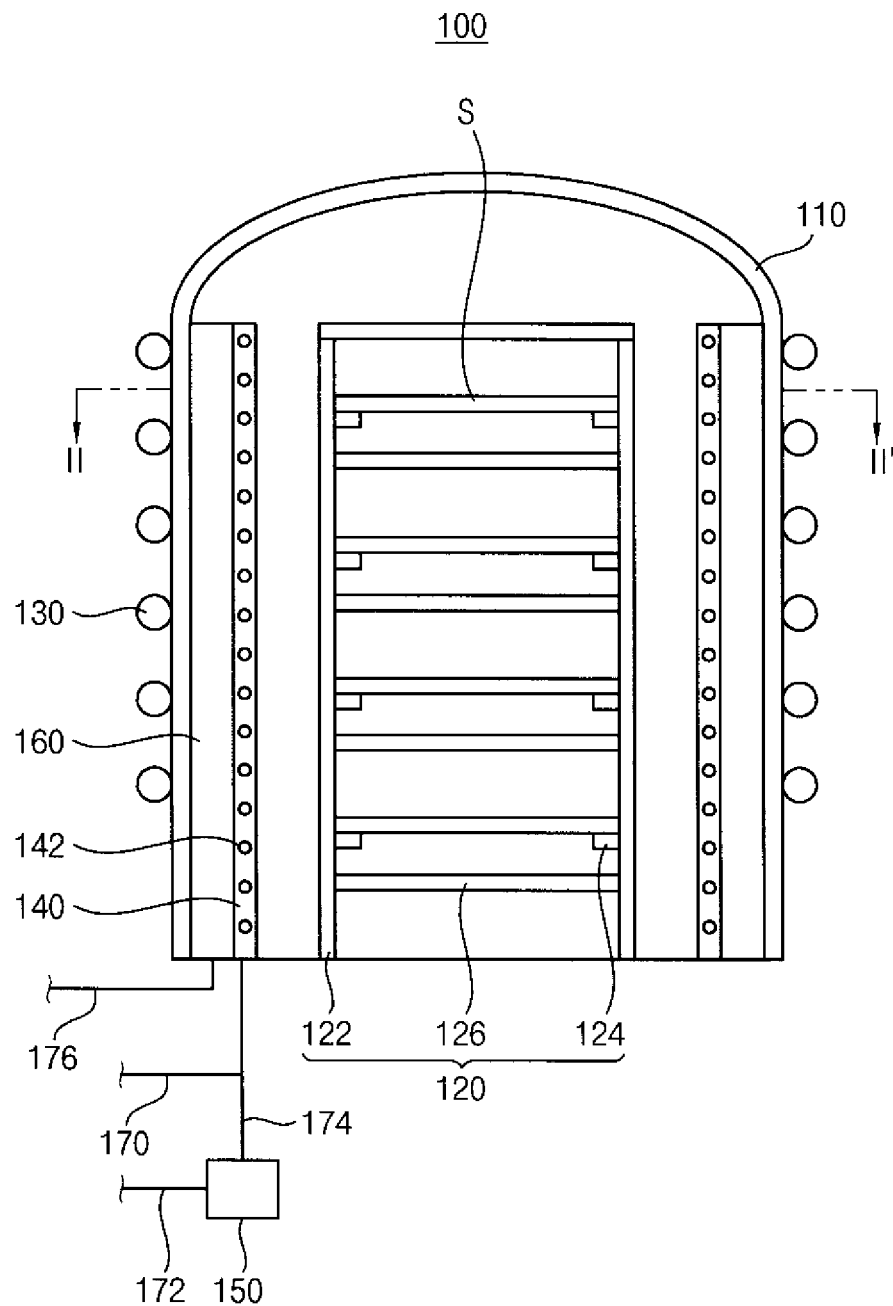
FIGS. 1 to 10 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an region illustrated as a rectangle will, typically, have slightly rounded or curved features. Thus, the regions illustrated in the figures are schematic in nature and their shapes are not intended to limit the scope of the present invention.

Terms such as "same," "equidistant," or "parallel," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Apparatus for Forming an Epitaxial Layer

Figure 2:
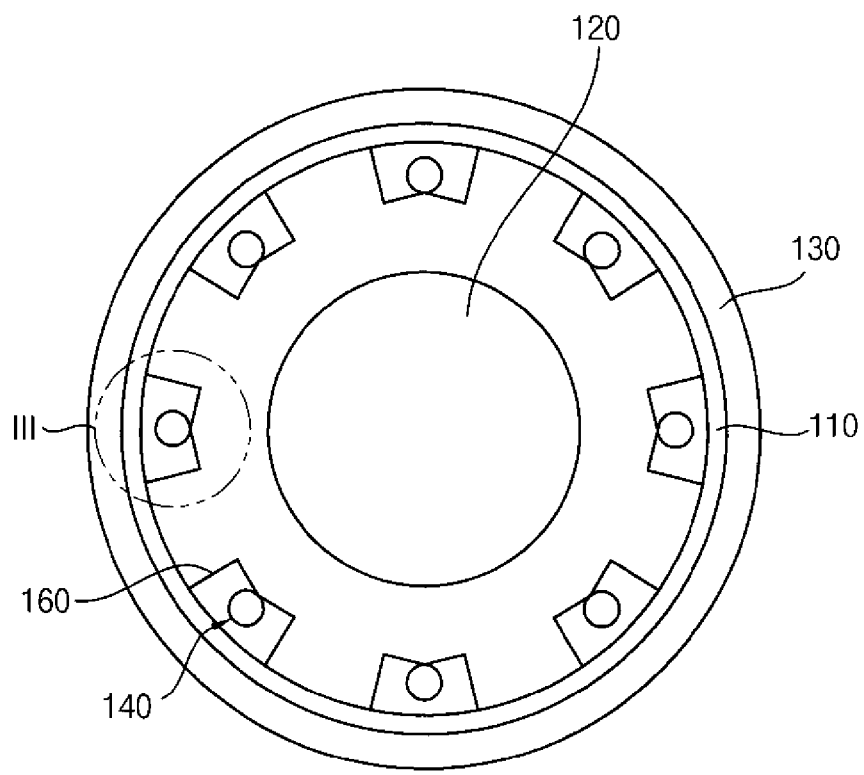
Figure 3:
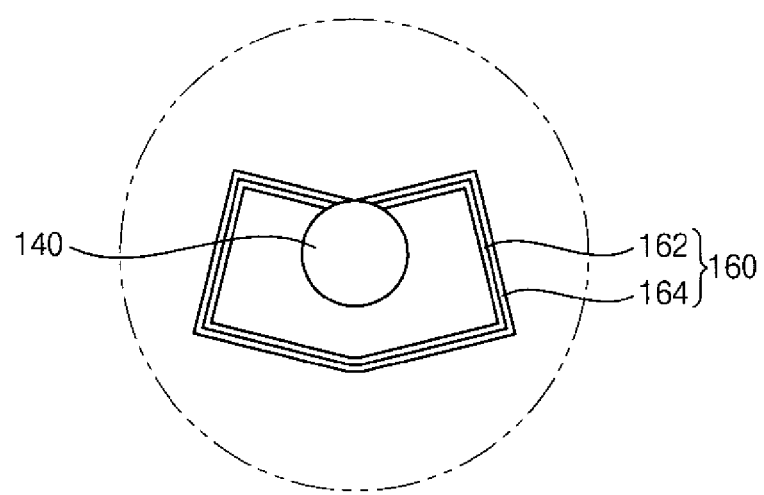
Figure 4:
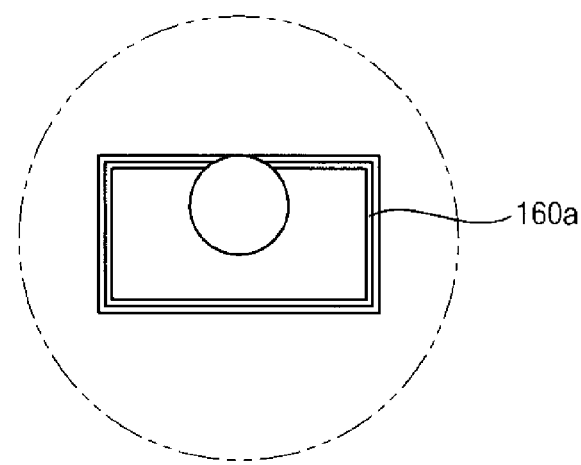
Figure 5:
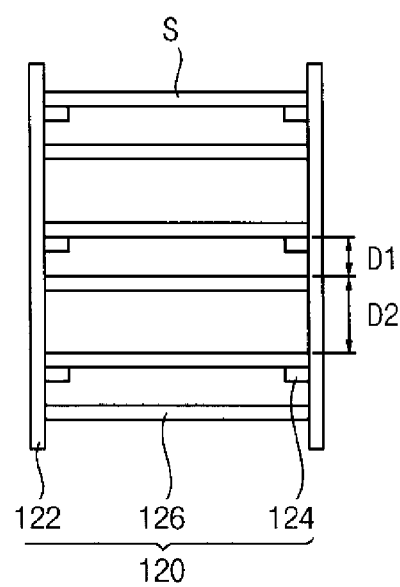
Figure 6:
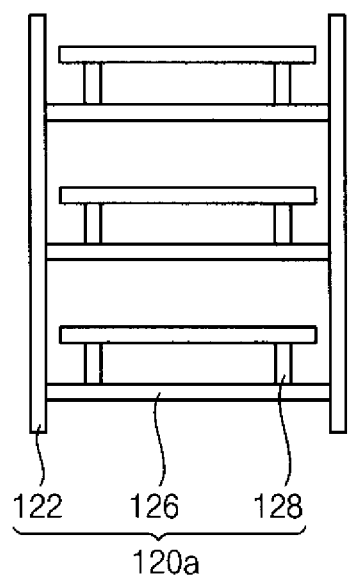

FIG. 1 is a cross-sectional view illustrating an apparatus for forming an epitaxial layer in accordance with example embodiments, FIG. 2 is a cross-sectional view taken along a line II-II' in FIG. 1, FIG. 3 is an enlarged cross-sectional view of a portion III in FIG. 2 illustrating a cooling unit of the apparatus, FIG. 4 is a cross-sectional view illustrating a cooling unit of an apparatus in accordance with example embodiments, FIG. 5 is an enlarged cross-sectional view illustrating a boat of the apparatus in FIG. 1, and FIG. 6 is a cross-sectional view illustrating a boat of an apparatus in accordance with example embodiments.

Referring to FIG. 1, an apparatus 100 for forming an epitaxial layer in accordance with this example embodiment may include a reaction chamber 110, a boat 120, a heater 130, an injecting unit 140 and a decomposing unit 150.

The reaction chamber 110 may have an inner space configured to receive a plurality of semiconductor substrates S, a source gas and an etching gas. The epitaxial layer may be formed on an upper surface of each of the semiconductor substrates S using the source gas and the etching gas. In example embodiments, the reaction chamber 110 has a cylindrical shape. Alternatively, the reaction chamber 110 may have a rectangular parallelepiped shape.

The heater 130 may be installed on an outer surface of the reaction chamber 110. The heater 130 may heat the inner space of the reaction chamber 110 to decompose the source gas and the etching gas. Referring to FIG. 2, the heater 130 may have a coiled shape configured to surround the outer surface of the reaction chamber 110. Alternatively, the heater 130 may be arranged in the inner space of the reaction chamber 110. Further, the heater 130 may be built in a wall of the reaction chamber 110.

The boat 120 may be arranged in the inner space of the reaction chamber 110. The boat 120 may be configured to receive the semiconductor substrates S. The semiconductor substrates S may be horizontally placed in an inner space of the boat 120.

In example embodiments, referring to FIG. 5, the boat 120 may include a boat body 122, substrate holders 124 and blocking plates 126. The boat body 122 may have the inner space configured to receive the semiconductor substrates S. The substrate holders 124 may be extended from an inner surface of the boat 122 to support lower edge portions of the semiconductor substrates S. The boat 120 may also be referred to as a multi-substrate receiving structure having outer walls, blocking plates, and substrate support members.

In example embodiments, the substrate holders 124 are arranged by substantially the same vertical interval. Thus, the semiconductor substrates S on the substrate holders 124 may also be arranged by substantially the same vertical interval. When intervals between the substrate holders 124 are different from each other, the semiconductor substrates S on the substrate holders 124 may be arranged by different intervals. In this case, upper spaces over the different semiconductor substrates S may have different volumes. The source gases and the etching gases distributed in the upper spaces having the different volumes may have different amounts. As a result, the epitaxial layers on the different semiconductor substrates S may not have a uniform distribution. In one embodiment, in order to provide the epitaxial layers with the uniform distribution, the semiconductor substrates S are provided with the substantially the same vertical interval between them. In one embodiment, the vertical interval between the substrate holders 124 may be substantially the same.

The blocking plates 126 may be extended from the inner surface of the boat body 122. The blocking plates 126 may be arranged between the substrate holders 124. Each of the blocking plates 126 may divide the upper spaces over the each of the semiconductor substrates S into two spaces to block interferences between the semiconductor substrates S. When the blocking plates 126 do not exist between the semiconductor substrates S, the source gas introduced into the spaces between the semiconductor substrates S may be applied to a lower surface of an upper semiconductor substrate as well as an upper surface of a lower semiconductor substrate to form an undesired epitaxial layer on the lower surface of the upper semiconductor substrate. Further, because a sufficient amount of the source gas may not be applied to the lower semiconductor substrate, the epitaxial layer having a desired thickness may not be formed on the lower semiconductor substrate. Thus, the blocking plates 126 between the semiconductor substrates S may block the interferences between the semiconductor substrates S. In example embodiments, the blocking plates 126 may be arranged by substantially the same vertical interval. In relation to a particular blocking plate 126, an upper semiconductor substrate may be referred to as an overhead semiconductor substrate, located above the blocking plate 126, and a lower semiconductor substrate may be referred to as an underneath semiconductor substrate, located below the blocking plate 126.

In example embodiments, a distance D1 between the blocking plate 126 and the upper semiconductor substrate S may be shorter than a distance D2 between the blocking plate 126 and the lower semiconductor substrate S. For example, the blocking plate 126 may be positioned closer to an upper substrate holder 124 for supporting the upper semiconductor substrate S than a lower substrate holder 124 for supporting the lower semiconductor substrate S. Thus, more semiconductor substrates S may be received in the boat 120 than in prior art systems. Particularly, a height of the boat 120 may be restricted by a height of the reaction chamber 110. Further, in certain embodiments, in order to form the epitaxial layer having the desired thickness, the space between the lower semiconductor substrate S and the blocking plate 126 may need to have a certain volume, for example, above a particular threshold. In contrast, an amount of the source gas introduced into the space between the upper semiconductor substrate S and the blocking plate 126 may have no relation to the formation of the epitaxial layer. As such, the space between the upper semiconductor substrate S and the blocking plate 126 may not have a volume limit. Therefore, a greater number of substrate holders 124 may be arranged in the boat 120 by setting the distance D1 between the upper semiconductor substrate S (or upper substrate holder 124) and the blocking plate 126 shorter than the distance D2 between the lower semiconductor substrate S (or lower substrate holder 124) and the blocking plate 126. As a result, the epitaxial layers may be simultaneously formed on a great amount of the semiconductor substrates S by a single process.

Alternatively, referring to FIG. 6, a boat 120a may include a boat body 122, blocking plates 126 and supporting pins 128. The boat body 122 and the blocking plates 126 in FIG. 6 may have functions and shapes substantially the same as those of the boat body 122 and the blocking plates 126 in FIG. 5. Thus, any further illustrations with respect to the boat body 122 and the blocking plates 126 in FIG. 6 are omitted herein for brevity. The supporting pins 128 may be vertically formed on upper surfaces of the blocking plates 126 to support the lower surfaces of the semiconductor substrates S.

Referring to FIG. 1, the injecting unit 140 may be arranged between the outer walls of the reaction chamber 110 and the boat 120. The injecting unit 140 may have a plurality of injecting holes 142 configured to inject the source gas and the etching gas to the inner space of the reaction chamber 110. Referring to FIG. 2, a plurality of injectors of the injecting unit 140 may be arranged in the reaction chamber 110, such as on the circular inner surface of the reaction chamber 110. The injecting unit 140 or an individual injector may be referred to herein more generally as a supply unit. In the embodiment of FIG. 1, a supply unit for supplying source gas and etch gas to the chamber includes a plurality of openings for supplying the source gas and the etching gas to the chamber 110.

In example embodiments, the apparatus 100 further includes one or more cooling units 160. In one embodiment, each cooling unit 160 may cool an injector of the injecting unit 140 to prevent the source gas from being decomposed in the injecting unit 140. Thus, the injecting holes 142 may not be clogged with decomposed source gases. In one embodiment, in the case where a plurality of injectors are included, a plurality of respective cooling units 160 may also be included.

Referring to FIG. 3, the cooling unit 160 may include a cooling duct configured to surround the injecting unit 140. The injecting holes 142 may be exposed from the cooling duct 160. A cooling gas may pass through a passageway between the cooling duct 160 and the injecting unit 140 to cool the source gas in the injecting unit 140. Thus, as shown in FIG. 1, a cooling gas line 176 may be connected to the cooling duct 160. In example embodiments, the cooling gas may include a nitrogen gas.

In example embodiments, because the injecting unit 140 is positioned in the inner space of the reaction chamber 110 heated by the heater 130, the heat generated from the heater 130 may be transferred to the injecting unit 140. In order to prevent the transfer of the heat, the cooling duct 160 may be positioned between the heater 130 and an injector of the injecting unit 140. Also, the cooling duct 160 may have a triple structure including a quartz member 162 and an adiabatic member 164 inserted into the quartz member 162. Alternatively, the cooling duct 160 may include only the adiabatic member 164.

In example embodiments, when the reaction chamber 110 has the cylindrical shape, the inner surface of the reaction chamber 110 may also have the circular shape. Thus, the cooling duct 160 may have a curved shape having a curvature substantially the same as that of the inner surface of the reaction chamber 110.

Alternatively, as shown in FIG. 4, when the reaction chamber 110 has the rectangular parallelepiped shape, the inner surface of the reaction chamber 110 may have a linear shape. Thus, a cooling duct 160a may have a linear shape corresponding to the linear inner surface of the reaction chamber 110.

Referring to FIG. 1, the decomposing unit 150 may be connected with the injecting unit 140 via a mixed gas line 174. The mixed gas line 174 may be connected to a source gas line 170. Thus, the source gas may be supplied to the injecting unit 140 through the source gas line 170 and the mixed gas line 174.

The decomposing unit 150 may be connected to an etching gas line 172. The decomposing unit 150 may decompose the etching gas supplied through the etching gas line 172. That is, the decomposing unit 150 may previously decompose the etching gas before the etching gas is introduced into the reaction chamber 110. Therefore, the decomposed etching gases and the source gas may be supplied to the injecting unit 140 through the mixed gas line 174. The injecting unit 140 may inject the decomposed etching gases and the source gas into the reaction chamber 110. In example embodiments, the decomposing unit 150 includes a plasma processing unit configured to convert the etching gas into plasma.

Because of the cooling units 160, a large amount of the etching gas injected into the reaction chamber 110 may not be decomposed by the heat of the heater 130. As a result, a portion of the epitaxial layer on a desired portion of the semiconductor substrate S, for example on an insulating layer of the semiconductor substrate, may not be completely removed. In addition, the epitaxial layer on the semiconductor substrate S may not have uniform distribution. Therefore, in example embodiments, the decomposing unit 150 may previously decompose the etching gas. Thus, a sufficient amount of the decomposed etching gases may be applied to the semiconductor substrates S so that the portion of the epitaxial layer on the insulating layer may be completely removed. As a result, the epitaxial layer on the semiconductor substrate S may have the uniform distribution.

In example embodiments, the cooling gas for cooling the injecting unit 140 may have a temperature at which the decomposed etching gases may not be bonded to each other. For example, when the temperature is at a cooling temperature above a particular threshold, the decomposed etching gases may not be bonded to each other.

In example embodiments, the etching gas may include a hydrogen chloride (HCL) gas. The source gas may include an $SiH_4$ gas, an $SiH_2Cl_2$ gas, etc.

According to this example embodiment, the etching gas may be previously decomposed. Thus, the batch type apparatus may be capable of together providing the source gas and the etching gas to the reaction chamber.

Figure 7:
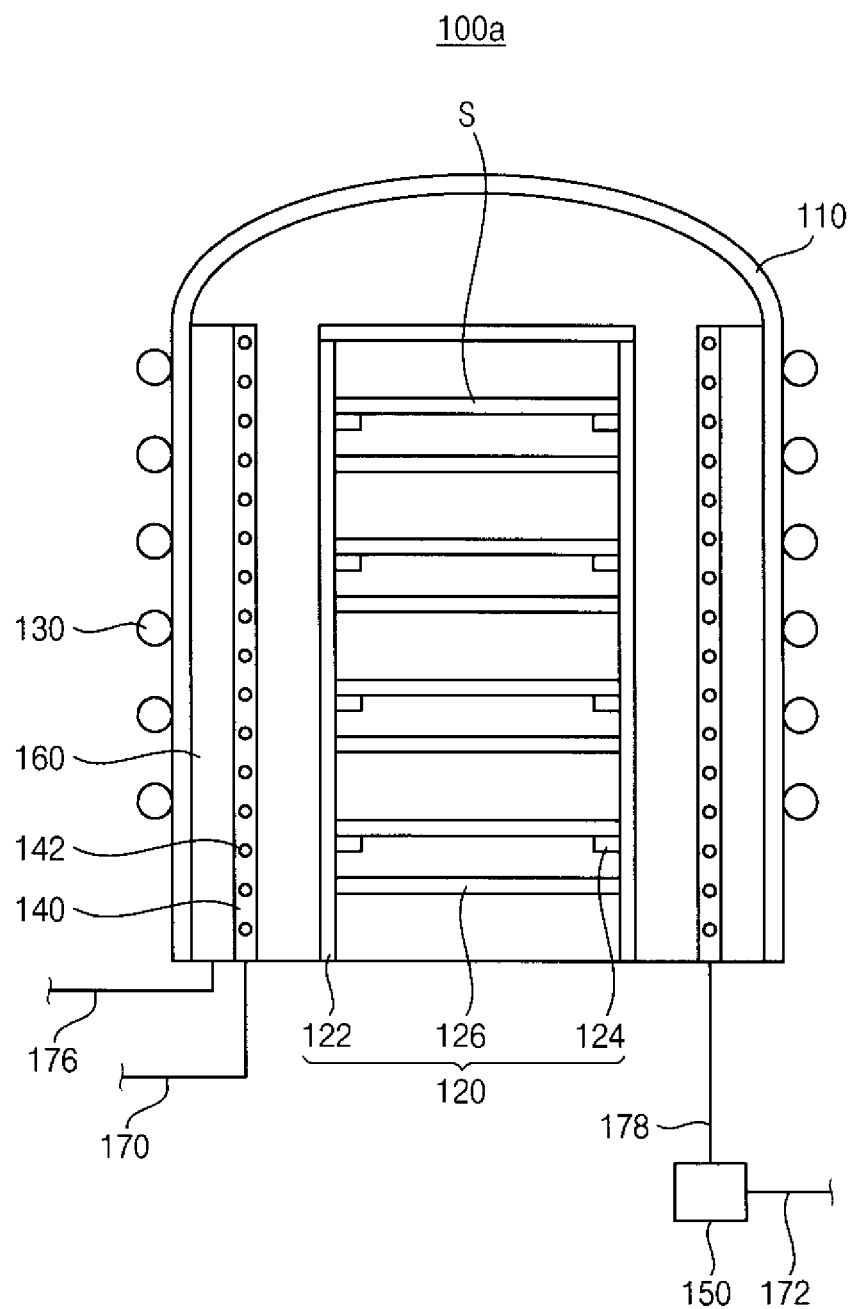

FIG. 7 is a cross-sectional view illustrating an apparatus for forming an epitaxial layer in accordance with example embodiments.

An apparatus 100a of this example embodiment may include elements substantially the same as those of the apparatus 100 in FIG. 1 except for an injecting unit. Thus, the same reference numerals may refer to the same elements and any further illustrations with respect to the same elements may be omitted herein for brevity.

Referring to FIG. 7, an injecting unit 140a of this example embodiment may include at least a first injector 144 and at least a second injector 146. The first injector 144 may inject only the source gas into the reaction chamber 110. Thus, only the source gas line 170 may be connected to the first injector 144. Further, the cooling unit 160 may be provided to only the first injector 144 and not to the second injector. Though one first injector 144 and one second injector 146 are shown, additional first injectors and additional second injectors may be included in the apparatus 100a.

In one embodiment, the second injector 146 injects only the decomposed etching gases into the reaction chamber 110. Thus, the decomposing unit 150 may be connected with the second injector 146 via the decomposed etching gas line 178. The etching gas line 172 may be connected to the decomposing unit 150. In contrast, the cooling unit 160 may not be provided to the second injector 146.

In example embodiments, because only the source gas is supplied to the first injector 144, the cooling unit 160 may cool the source gas to a sufficiently low temperature. Thus, the clogging of the injecting holes 142 caused by the source gas decomposed in the first injector 144 may be completely prevented.

In contrast, because the cooling unit 160 is not provided to the second injector 146, the bonding of the decomposed etching gases in the second injector 146 caused by the cooling unit 160 may be completely prevented.

System for Forming an Epitaxial Layer

Figure 8:
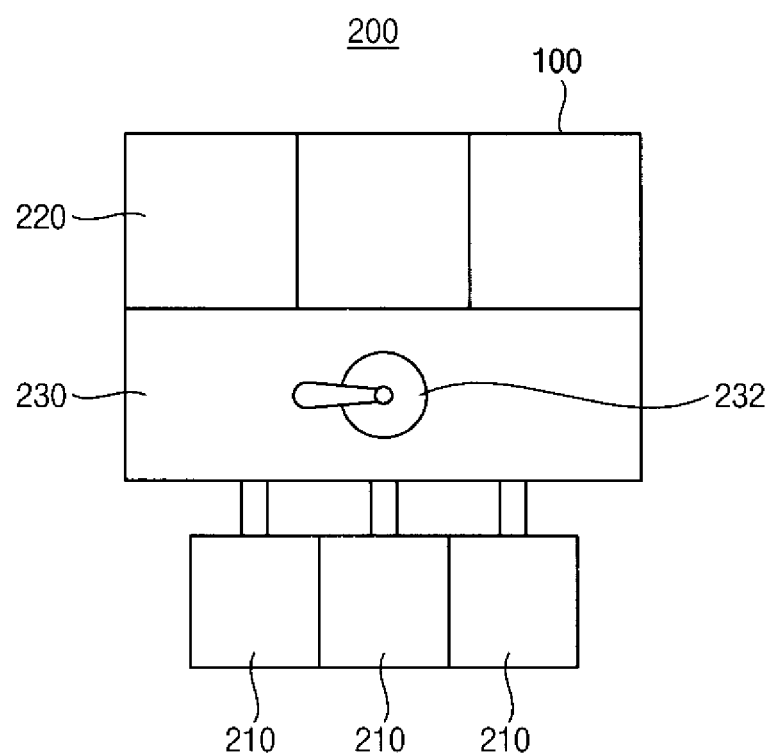

FIG. 8 is a plan view illustrating a system for forming an epitaxial layer including the apparatus in FIG. 1, according to one exemplary embodiment.

Referring to FIG. 8, a system 200 for forming an epitaxial layer in accordance with this example embodiment may include two apparatuses 100 for forming the epitaxial layer, three loadlock chambers 210, an etching chamber 220 and a transfer chamber 230.

In example embodiments, the etching chamber 220 and the apparatuses 100 may face the loadlock chambers 210. For example, the etching chamber 220 and the apparatuses 100 may have front doors facing front doors of the loadlock chambers 210. The transfer chamber 230 may be positioned between the etching chamber 220 and the apparatuses 100.

The etching chamber 220 and the apparatuses 100 may be sequentially arranged. Further, the etching chamber 220 and the apparatuses 100 may be parallel to each other. The transfer chamber 230 may have a rectangular horizontal cross-section.

In example embodiments, the apparatuses 100 may have a structure substantially the same as that of the apparatuses 100 in FIG. 1. Thus, any further illustrations with respect to the apparatuses 100 may be omitted herein for brevity. Alternatively, the system 200 may include the apparatus 100a in FIG. 7 in place of the apparatus 100 in FIG. 1.

As mentioned above, the apparatuses 100 may correspond to a batch type apparatus for simultaneously forming the epitaxial layers on the semiconductor substrates. Thus, the system 200 may have a clustered structure where the loadlock chambers 210, the etching chamber 220 and the batch type apparatuses 100 may be arranged at both sides of the transfer chamber 230. Particularly, because the system 200 may have a rectangular parallelepiped structure, a space where the system 200 may occupy may be minimized.

The semiconductor substrates on which the epitaxial layers are to be formed may be on standby in the loadlock chambers 210. The semiconductor substrates on which the epitaxial layers may be formed may be unloaded from the apparatuses 100 to the loadlock chambers 210. Process conditions corresponding to those for forming the epitaxial layer may be set in the loadlock chambers 210.

The transfer chamber 230 may have a transfer robot 232. The transfer robot 232 may transfer the semiconductor substrates from the loadlock chambers 210 to the etching chamber 220.

The etching chamber 220 may etch native oxide layers formed on the semiconductor substrates. In example embodiments, the etching chamber 220 may include a plasma etching chamber for etching the native oxide layers using the plasma.

The transfer robot 232 may transfer the semiconductor substrates from the etching chamber 220 to the apparatuses 100. The apparatuses 100 may form the epitaxial layers on the semiconductor substrates. In example embodiments, the apparatuses 100 may be repaired through rear doors of the apparatuses 100.

The transfer robot 232 may unload the semiconductor substrates on which the epitaxial layers may be formed to the loadlock chambers 210.

Method of Forming an Epitaxial Layer

Figure 9:
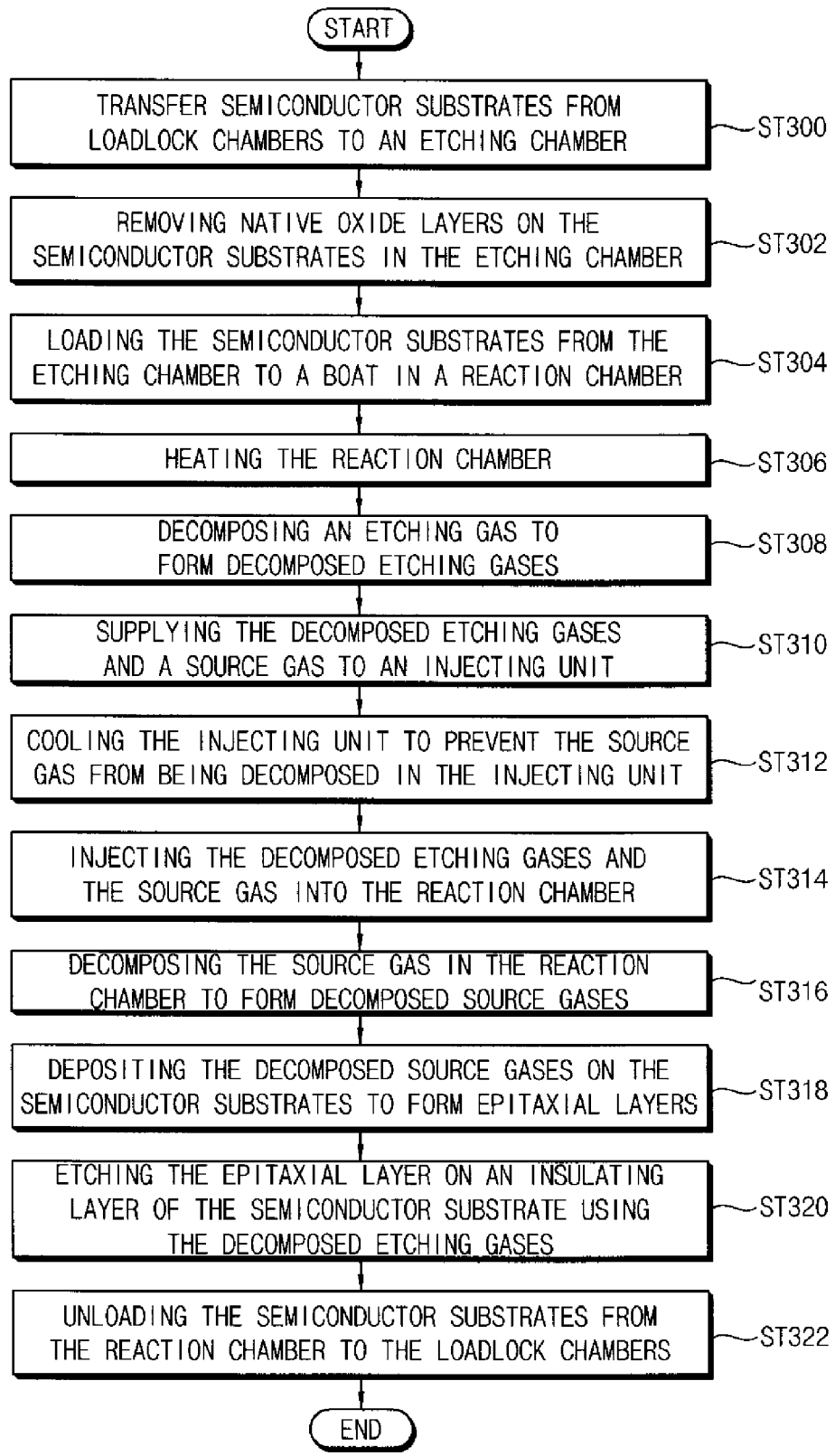

FIG. 9 is a flow chart illustrating an exemplary method of forming an epitaxial layer using the apparatus in FIG. 1 and the system in FIG. 8, according to one embodiment.

Referring to FIGS. 1, 8 and 9, in step ST300, the transfer chamber 230 transfers the semiconductor substrates to the etching chamber 220.

In step ST302, the etching chamber 220 etches the native oxide layers on the semiconductor substrates using the plasma.

In step ST304, the transfer chamber 230 loads the semiconductor substrates from the etching chamber 220 to the boat 120 in the reaction chamber 110. The semiconductor substrates may be placed on the substrate holders 124 of the boat 120.

In step ST306, the heater 130 heats the reaction chamber 110 to provide the inner space of the reaction chamber 110 with a temperature at which the epitaxial layer may be formed.

In step ST308, the decomposing unit 150 decomposes the etching gas to form decomposed etching gases. In example embodiments, the etching gas may include HCl so that the decomposed etching gases may include an H gas and a Cl gas.

In step ST310, the decomposed etching gas and the source gas are supplied to the injecting unit 140 through the mixed gas line 174.

In step ST312, the cooling unit 160 cools the injecting unit 140 to prevent the source gas from being decomposed in the injecting unit 140. In example embodiments, the nitrogen gas may pass through the passageway between the cooling duct 160 and the injecting unit 140 to cool the source gas. In contrast, the nitrogen gas may have a temperature at which the decomposed etching gases may not be bonded to each other. Therefore, the temperature of the cooling unit may be set to a value cool enough to prevent most source gases from being decomposed, but still warm enough to prevent most of the etching gas from being bonded to each other.

In step ST314, the injecting unit 140 injects the decomposed etching gases and the source gas into the reaction chamber 110.

In step ST316, the injected source gas is decomposed in the heated reaction chamber 110. In example embodiments, the source gas may include an $SiH_4$ gas or an $SiH_2Cl_2$ gas, the decomposed source gases may include an Si gas and an H gas and/or an HCl gas.

In step ST318, the decomposed source gases are deposited on the semiconductor substrates to form the epitaxial layers on the semiconductor substrates.

In step ST320, the decomposed etching gases etch portions of the epitaxial layers on the insulating layers of the semiconductor substrates. In example embodiments, forming the epitaxial layer and etching the epitaxial layer may be performed simultaneously with each other.

In step ST322, the transfer chamber 230 unloads the semiconductor substrates from the reaction chamber 110 to the loadlock chambers 210.

Figure 10:
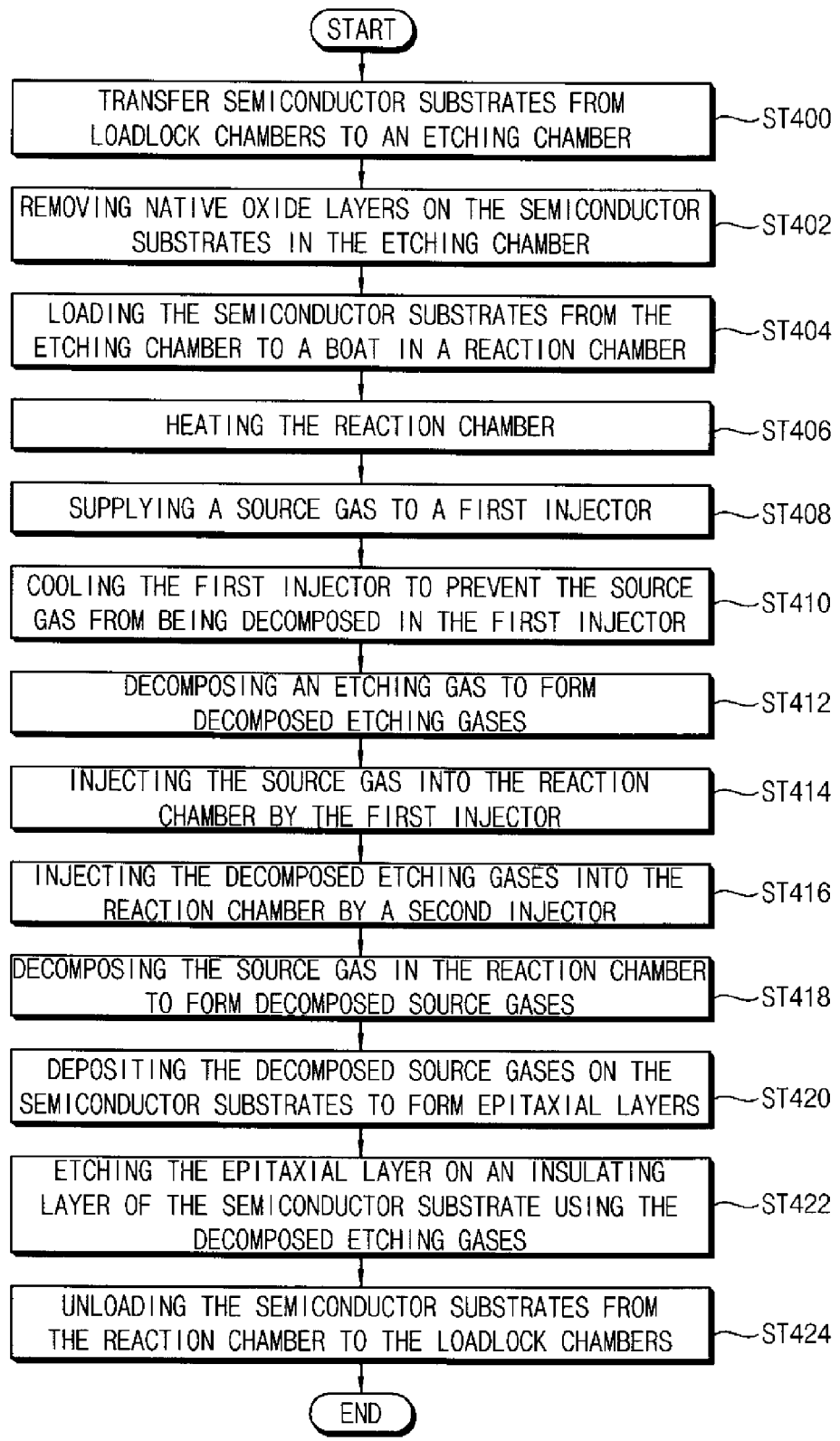

FIG. 10 is a flow chart illustrating an exemplary method of forming an epitaxial layer using the apparatus in FIG. 7 and the system in FIG. 8, according to one embodiment.

Referring to FIGS. 7, 8 and 10, in step ST400, the transfer chamber 230 transfers the semiconductor substrates to the etching chamber 220.

In step ST402, the etching chamber 220 etches the native oxide layers on the semiconductor substrates using the plasma.

In step ST404, the transfer chamber 230 loads the semiconductor substrates from the etching chamber 220 to the boat 120 in the reaction chamber 110. The semiconductor substrates may be placed on the substrate holders 124 of the boat 120.

In step ST406, the heater 130 heats the reaction chamber 110 to provide the inner space of the reaction chamber 110 with a temperature at which the epitaxial layer may be formed.

In step ST408, the source gas is supplied to the first injector 144.

In step ST410, the cooling unit 160 cools the first injector 144 to prevent the source gas from being decomposed in the first injector 144.

In step ST412, the decomposing unit 150 decomposes the etching gas to form decomposed etching gases. In example embodiments, the etching gas may include HCl so that the decomposed etching gases may include an H gas and a Cl gas.

In step ST414, the first injector 144 injects the source gas into the reaction chamber 110.

In step ST416, the second injector 146 injects the decomposed etching gases into the reaction chamber 110. In example embodiments, injecting the source gas and injecting the decomposed etching gases may be performed simultaneously with each other.

In step ST418, the injected source gas is decomposed in the heated reaction chamber 110. In example embodiments, the source gas may include an $SiH_4$ gas or an $SiH_2Cl_2$ gas, the decomposed source gases may include an Si gas and an H gas and/or an HCl gas.

In step ST420, the decomposed source gases are deposited on the semiconductor substrates to form the epitaxial layers on the semiconductor substrates.

In step ST422, the decomposed etching gases etch portions of the epitaxial layers on the insulating layers of the semiconductor substrates. In example embodiments, forming the epitaxial layer and etching the epitaxial layer may be performed simultaneously with each other.

In step ST424, the transfer chamber 230 unloads the semiconductor substrates from the reaction chamber 110 to the loadlock chambers 210.

According to certain example embodiments, before the etching gas is introduced into the reaction chamber, the etching gas is previously decomposed. The decomposed etching gases may then be introduced into the reaction chamber to etch the epitaxial layer on the substrate. Thus, the epitaxial layer on the substrate may have a uniform distribution.

Further, the source gas may not be decomposed in the injecting unit because the cooling unit may cool the injecting unit so that injecting holes of the injecting unit are not clogged with the decomposed source gases decomposed in the injecting unit.

Furthermore, the system may include the loadlock chambers, the etching chamber and the batch type apparatuses having a clustered structure including blocking plates so that the epitaxial layers having the uniform distribution may be simultaneously formed on the substrates.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming an epitaxial layer on a substrate, the method comprising:
   decomposing an etching gas to form decomposed etching gases;
   supplying the decomposed etching gases and a source gas to an injecting unit in the reaction chamber after decomposing the etching gas to form the decomposed etching gases;
   heating the reaction chamber;
   applying a cooling gas to the injecting unit to cool the decomposed etching gases and the source gas in the injecting unit;
   decomposing the source gas to form decomposed source gases in the reaction chamber;
   applying the decomposed source gas in the reaction chamber to a substrate to form the epitaxial layer on the substrate; and
   etching a portion of the epitaxial layer on a specific region of the substrate using the decomposed etching gases in the reaction chamber.

2. The method of claim 1, wherein decomposing the etching gas comprises converting the etching gas into plasma.

3. The method of claim 1, wherein applying the cooling gas includes cooling the source gas to prevent the source gas from being decomposed before applying the source gas to the substrate.

4. The method of claim 3, wherein cooling the source gas comprises supplying the cooling gas to a cooling unit to cool the source gas.

5. The method of claim 1, further comprising etching a native oxide layer on the substrate.

6. The method of claim 1, further comprising:
performing the decomposing of the etching gas in a decomposing unit outside the reaction chamber.

7. The method of claim 1,
wherein the etching gas includes HCl and the decomposed etching gases include H and Cl decomposed from the HCl.

8. The method of claim 6, further comprising:
forming an epitaxial layer on a second substrate simultaneously with forming the epitaxial layer on the substrate by using a multi-substrate receiving structure inserted into the reaction chamber.

9. The method of claim 8, wherein:
the multi-substrate receiving structure includes blocking plates disposed between upper substrate holders and lower substrate holders.

10. The method of claim 9, wherein:
for each blocking plate, an upper substrate holder adjacent the blocking plate above the blocking plate is further from the blocking plate than a lower substrate holder adjacent the blocking plate below the blocking plate.

11. The method of claim 1, further comprising:
supplying the etching gas and the source gas from a mixed gas line to the injecting unit.

12. A method of forming an epitaxial layer on a substrate, the method comprising:
decomposing an etching gas to form decomposed etching gases;
supplying the decomposed etching gases together with a source gas to a reaction chamber;
decomposing the source gas in the reaction chamber;
applying the decomposed source gas to a substrate in the reaction chamber to form the epitaxial layer on the substrate; and
etching a portion of the epitaxial layer on a specific region of the substrate using the decomposed etching gases,
wherein the etching gas includes HCl and the decomposed etching gases include H and Cl decomposed from the HCl.

13. The method of claim 12, further comprising:
supplying the source gas and decomposed etching gas to the reaction chamber through an injecting unit in the reaction chamber; and
cooling the source gas and decomposed etching gas while in the injecting unit.

14. A method of forming an epitaxial layer on a substrate, the method comprising:
decomposing an etching gas to form decomposed etching gases;
supplying the decomposed etching gas together with a source gas through a mixed gas line to an injecting unit in the reaction chamber;
heating the reaction chamber;
cooling the injecting unit to cool the decomposed etching gases and the source gas in the injecting unit;
decomposing the source gas in the reaction chamber;
applying the decomposed source gas to a substrate in the reaction chamber to form the epitaxial layer on the substrate; and
etching a portion of the epitaxial layer on a specific region of the substrate using the decomposed etching gases.

15. The method of claim 14, further comprising cooling the injecting unit by applying a cooling gas to the injecting unit.

16. The method of claim 14, wherein the etching gas includes HCl and the decomposed etching gases include H and Cl decomposed from the HCl.

* * * * *